(12) United States Patent
Thorsen

(10) Patent No.: US 12,690,161 B2
(45) Date of Patent: Jul. 21, 2026

(54) TEMPERATURE-CONTROLLED ENCLOSURE FOR CONTAINING TEMPERATURE-SENSITIVE ELECTRONIC AND/OR TELECOMMUNICATIONS EQUIPMENT

(71) Applicant: ENERGY COOL APS, Fredericia (DK)

(72) Inventor: Henrik Thorsen, Fredericia (DK)

(73) Assignee: ENERGY COOL GLOBAL APS, Fredericia (DK)

( * ) Notice: Subject to any disclaimer, the term of this patent is extended or adjusted under 35 U.S.C. 154(b) by 141 days.

(21) Appl. No.: 18/702,020

(22) PCT Filed: Oct. 19, 2022

(86) PCT No.: PCT/EP2022/079151
§ 371 (c)(1),
(2) Date: Apr. 17, 2024

(87) PCT Pub. No.: WO2023/067034
PCT Pub. Date: Apr. 27, 2023

(65) Prior Publication Data
US 2025/0240914 A1 Jul. 24, 2025

(30) Foreign Application Priority Data

Oct. 22, 2021 (DK) ............................ PA 202101008

(51) Int. Cl.
*H05K 7/20* (2006.01)
(52) U.S. Cl.
CPC ..... *H05K 7/20209* (2013.01); *H05K 7/20145* (2013.01)

(58) Field of Classification Search
CPC ........... H05K 7/20745; H05K 7/20836; H05K 7/2059; H05K 7/20827; H05K 7/20209; F24F 5/0021; F24F 11/47; F24F 2110/12
See application file for complete search history.

(56) References Cited

U.S. PATENT DOCUMENTS

| | | | | |
|---|---|---|---|---|
| 8,583,289 | B2 * | 11/2013 | Stack ....................... | F24F 11/63 700/278 |
| 9,681,589 | B1 | 6/2017 | Ross et al. | |
| 10,299,408 | B1 * | 5/2019 | Lachapelle ........ | H05K 7/20745 |
| 10,888,027 | B1 | 1/2021 | Pichai et al. | |
| 2009/0210096 | A1 * | 8/2009 | Stack ....................... | F24F 11/76 700/278 |

(Continued)

FOREIGN PATENT DOCUMENTS

| | | |
|---|---|---|
| CN | 101 737 880 B1 | 1/2021 |
| EP | 3026357 A2 | 6/2016 |

(Continued)

OTHER PUBLICATIONS

Danish Search Report for Application No. PA 2021 01008 filed Oct. 22, 2021, report completed May 11, 2022, 4 pages.

(Continued)

*Primary Examiner* — Nelson J Nieves
(74) *Attorney, Agent, or Firm* — Francis J. Maguire; WARE FRESSOLA MAGUIRE & BARBER LLP

(57) ABSTRACT

A temperature-controlled enclosure for containing temperature-sensitive electronic and/or telecommunications equipment is shown. The enclosure is capable of selecting the most economically feasible way of cooling at a given time.

12 Claims, 9 Drawing Sheets

(56) References Cited

U.S. PATENT DOCUMENTS

| | | | | |
|---|---|---|---|---|
| 2012/0174612 A1* | 7/2012 | Madara | .................. | F24F 3/147 165/104.14 |
| 2013/0299157 A1* | 11/2013 | Murayama | ......... | H05K 7/20745 165/252 |
| 2015/0162801 A1* | 6/2015 | Czamara | ........... | H05K 7/20745 290/52 |
| 2015/0208553 A1* | 7/2015 | Bauchot | .................. | F24F 11/30 165/251 |
| 2015/0264836 A1* | 9/2015 | Ambriz | ............. | H05K 7/20181 165/104.34 |
| 2015/0305203 A1* | 10/2015 | Chang | ............... | H05K 7/20745 361/679.48 |
| 2016/0021792 A1* | 1/2016 | Minegishi | ......... | H05K 7/20745 165/281 |
| 2016/0223455 A1* | 8/2016 | Minegishi | ......... | H05K 7/20836 |
| 2017/0347499 A1 | 11/2017 | Ross et al. | | |

FOREIGN PATENT DOCUMENTS

| | | | | |
|---|---|---|---|---|
| EP | 3525563 A1 | 8/2019 | | |
| JP | 2014055691 A | * 3/2014 | ........ | H05K 7/20836 |
| WO | 2019045565 A1 | 3/2019 | | |
| WO | 2020183207 A1 | 9/2020 | | |

OTHER PUBLICATIONS

International Search Report and Written Opinion of the International Searching Authority (ISA/EP), Application No. PCT/EP20222/079151 filed Oct. 19, 2022, mailed Feb. 16, 2023, 13 pages.

* cited by examiner

TEMPERATURE-CONTROLLED ENCLOSURE FOR CONTAINING TEMPERATURE-SENSITIVE ELECTRONIC AND/OR TELECOMMUNICATIONS EQUIPMENT

TECHNICAL FIELD OF THE INVENTION

The present invention relates to cooling of electronic equipment.

BACKGROUND OF THE INVENTION

Effective cooling of data centers and other facilities operating telecommunications or computer equipment is a growing business. Electronic components create heat when operating and modern electronic equipment is fast and powerful, and generally generates substantially more heat than systems only a few years old. Hence, there is an increased need for cooling. Most cooling systems consume electrical energy and associated costs are skyrocketing. Hence, many facilities are experiencing problems in sourcing sufficient power required to cool modern electronic components as needed to prevent thermal damage to the equipment.

Cooling systems often utilize air conditioning units with a water tower, compressor type systems, or other sealed systems. The heat is transferred into the outside air by means of heat exchangers in a closed loop system with either glycol or water, or by supply from the compressor. The air conditioning units are usually placed directly in the electronic equipment environment and are positioned in what are thought to be strategic locations. Air conditioning units may also be utilized as the primary air filtration device to remove airborne contaminants. A common practice has been to locate air conditioning units near the electronic equipment that produce the most heat within the controlled environment. The purpose is to ensure plentiful cooling air is delivered to cool the equipment with highest heat output.

The increased density and speed of newer electronic equipment creates increasingly more heat, resulting in the need for increased cooling capacity to prevent thermal failure of the electronic equipment. The electricity required for cooling electronic data and telecommunications equipment can consume as much as half of the total electrical power utilized at facilities operating modern equipment. Many facilities simply do not have the power distribution infrastructure to obtain enough electricity nor adequate cooling efficiency to meet the increased heat output of new electronic equipment. If the cooling is inefficiently or ineffectively provided to the equipment, thermal failure of expensive components can result in communications and business interruption. Many organizations operating data center facilities are now forced to make a choice between retrofitting their existing facility or moving to a newer facility that is better designed to enable use of modern electronic equipment.

It is an objective of the present invention to provide an improved system for cooling computer data center and telecom equipment.

EP3026357 discloses a system comprising a housing with an external inlet, an external outlet, an internal inlet, an internal outlet, and is configurable to provide a first flow passage for conducting air between the external inlet and the internal outlet and to provide, a second flow passage for conducting air between the external inlet and the external outlet, and a third flow passage for conducting air between the internal inlet and the internal outlet. The internal outlet comprises means for generating a laminar airflow at the internal outlet.

SUMMARY OF THE INVENTION

The inventor of the present invention has developed a temperature-controlled enclosure for containing temperature-sensitive electronic and/or telecommunications equipment that is capable of selecting the most economically feasible way of cooling at a given time.

One aspect relates to a temperature-controlled enclosure for containing temperature-sensitive electronic and/or telecommunications equipment, said enclosure comprising:

a roof, a floor, and walls together defining the enclosure;

a first sensor unit configured to measure the temperature at a given time outside the enclosure;

a second sensor unit configured to measure the temperature at a given time inside the enclosure at the floor level;

a third sensor unit configured to measure the temperature at a given time inside the enclosure at the position of said electronic and/or telecommunications equipment;

a temperature control unit comprising:

a) a cabinet with a plurality of chambers, wherein a first chamber is empty, thereby providing a free cooling option, and wherein a second chamber comprises an air cooling unit;

b) a first air inlet adapted for leading air outside the enclosure into the cabinet and/or a second air inlet adapted for leading air from within the enclosure into the cabinet;

c) a first air outlet adapted for leading air inside the cabinet into the enclosure at the floor level;

d) a system of air flow ducts and air flow control units adapted for directing air from the air inlet(s) and through one or more of said chambers and out through the first air outlet; and e) a management component, preferably being part of a cloud platform, communicatively coupled to said first, second, and third sensor units, said management component comprising:

i) a processor;

ii) a memory in electronic communication with said processor; and iii) instructions stored in said memory, said instructions being executable by said processor to:

I) receive and store data related to an event detected by said sensor units;

II) process said data related to said detected event, including determining the need for cooling and the type of cooling within the enclosure; and III) based on the processing of said data, instruct said air flow control units to direct and distribute air from the air inlet(s) and through a selection of the cabinet's ducts and chambers; and a second air outlet, possibly integrated into the temperature control unit, positioned at the roof level and adapted for leading air out of the enclosure.

In one or more embodiments, the management component is connected to a web server through a network connection and configured to receive data about the current market price of electricity, preferably also configured to receive data forecasts about the future, such as within hours or days, market price of electricity, and in response to the processing of said data instruct said air flow control units to direct and distribute air from the air inlet(s) and through a selection of the cabinet's ducts and chambers.

The management component comprises a processor, a memory in electronic communication with said processor, and instructions stored in said memory. The instructions are executable by the processor to perform a number of tasks, including receive and store data related to an event detected by the sensor units, process said data related to said detected event, and based on the processing of said data, instruct the air flow control units to direct and distribute air from the air inlet(s) and through a selection of the cabinet's ducts and chambers. The event may e.g., be a registered temperature, a registered change or rate change in temperature, or received data about forecasted temperatures outside or inside the enclosure.

In the present context, the term "management component" may be software, firmware, middleware, microcode, hardware, and/or any combination thereof. For example, the management component or the manager may be any one or a combination of a module, a process, and a thread that are run on a general-purpose server or may be a general-purpose server. There may be one or more management components or managers. The management component or the manager may be located on one general-purpose server or may be distributed on at least two general-purpose servers. The management component or the manager may be obtained from a computer readable medium that stores various data structures and then is executed or may be implemented by using various logical combinations of a hardware circuit.

The management component may comprise a data collection and processing component. The term "data collection and processing component" as used herein means a system implemented at least in part by hardware and comprising an input device, an output device, and a processor connected to the input device to receive data from it and connected to the output device to provide data processed for it. The data collection and processing component may be configured to acquire data from the sensor units or from a webserver.

A data processing component may be integrated in the sensor units to pre-process data before it is sent to the management component. Such a data processing component is e.g., present to remove erroneous data, e.g., obvious outliers, or the like.

As an example, and in order for the data collection and processing component(s) to operate, the data collection and processing component(s) may comprise a computing system including a processor, a memory, a communication unit, an output device, an input device, and a data store, which may be communicatively coupled by a communication bus. The mentioned computing system should be understood as an example and that it may take other forms and include additional or fewer components without departing from the scope of the present disclosure. For instance, various components of the computing device may be coupled for communication using a variety of communication protocols and/or technologies including, for instance, communication buses, software communication mechanisms, computer networks, etc. The computing system may include various operating systems, sensors, additional processors, and other physical configurations. The processor, memory, communication unit, etc., are representative of one or more of these components. The processor may execute software instructions by performing various input, logical, and/or mathematical operations. The processor may have various computing architectures to method data signals (e.g., CISC, RISC, etc.). The processor may be physical and/or virtual and may include a single core or plurality of processing units and/or cores. The processor may be coupled to the memory via the bus to access data and instructions therefrom and store data therein. The bus may couple the processor to the other components of the computing system including, for example, the memory, the communication unit, the input device, the output device, and the data store. The memory may store and provide data access to the other components of the computing system. The memory may be included in a single computing device or a plurality of computing devices. The memory may store instructions and/or data that may be executed by the processor. For example, the memory may store instructions and data, including, for example, an operating system, hardware drivers, other software applications, databases, etc., which may implement the techniques described herein. The memory may be coupled to the bus for communication with the processor and the other components of computing system. The memory may include a non-transitory computer-usable (e.g., readable, writeable, etc.) medium, which can be any non-transitory apparatus or device that can contain, store, communicate, propagate, or transport instructions, data, computer programs, software, code, routines, etc., for processing by or in connection with the processor. In some implementations, the memory may include one or more of volatile memory and non-volatile memory (e.g., RAM, ROM, hard disk, optical disk, etc.). It should be understood that the memory may be a single device or may include multiple types of devices and configurations. The input device may include any device for inputting information into the computing system. In some implementations, the input device may include one or more peripheral devices. The output device may be any device capable of outputting information from the computing system. The data store may include information sources for storing and providing access to data. In some implementations, the data store may store data associated with a database management system (DBMS) operable on the computing system. For example, the DBMS could include a structured query language (SQL) DBMS, a NoSQL DMBS, various combinations thereof, etc. In some instances, the DBMS may store data in multi-dimensional tables comprised of rows and columns, and manipulate, e.g., insert, query, update and/or delete, rows of data using programmatic operations. The data stored by the data store may be organized and queried using various criteria including any type of data stored by them. The data store may include data tables, databases, or other organized collections of data. The data store may be included in the computing system or in another computing system and/or storage system distinct from but coupled to or accessible by the computing system. The data stores can include one or more non-transitory computer-readable mediums for storing the data. In some implementations, the data stores may be incorporated with the memory or may be distinct therefrom. The components may be communicatively coupled by the bus and/or the processor to one another and/or the other components of the computing system. In some implementations, the components may include computer logic (e.g., software logic, hardware logic, etc.) executable by the processor to provide their acts and/or functionality. These components may be adapted for cooperation and communication with the processor and the other components of the computing system.

In one or more embodiments, when the electricity market price is below a predetermined threshold, the management component is configured to activate the air-cooling unit. Obviously, the activation of the air-cooling unit is only performed if needed, such as if there is a need for cooling the air within the enclosure or if a cooling reservoir needs to be charged (see below).

In one or more embodiments, when the electricity market price is above a predetermined threshold, the management component is configured to deactivate the air-cooling unit.

In one or more embodiments, the cabinet further comprises a third chamber with a cooling reservoir or at least a part of a cooling reservoir. In the latter situation, the cooling reservoir may comprise a first radiator positioned within the third chamber and operably coupled to a second radiator positioned within an external tank filled with a phase change material (see further below). The tank may preferably be located within the ground, preferably within a few meters from the enclosure. The first and second radiators may be connected by tubing (e.g., hoses or tubes) and a coolant, such as water (e.g., mixed with an antifreeze, such as isopropanol or the like), is circulated therein back and forth between the first and second radiators, e.g., by a pump unit. A coolant expansion tank (e.g., with a pressure valve/cap) may also be operably coupled between the first and second radiators. A non-limiting example of a suitable radiator is a radiator that comprises a core mounted between a top and a bottom tank. The core comprises a large number of narrow vertical tubes, through which the hot coolant falls. Fins, often corrugated, are attached laterally to the tubes to support them and to increase the cooling area so that the heat can more easily be transferred to the surroundings; for the first radiator, the surrounding air, and for the second radiator, the surrounding phase change material.

In one or more embodiments, the cabinet further comprises a third chamber with a part of a cooling reservoir, wherein the part of the cooling reservoir positioned within the third chamber comprises a first radiator, wherein the cooling reservoir further comprises a tank filled with a phase change material and positioned outside said enclosure, a coolant, and a second radiator positioned within said tank, wherein said first radiator is operably coupled to said second radiator and wherein said coolant is circulated between said first and second radiator by a pump unit.

In one or more embodiments, the management component is configured to charge the cooling reservoir by instructing the air flow control units to:

direct air outside the enclosure, through the system of air flow ducts, and into said third chamber, and/or direct cooled air from the air-cooling unit, through the system of air flow ducts, and into said third chamber.

The entire cooling reservoir may alternatively be present in the third chamber.

In one or more embodiments, the management component is configured to charge the cooling reservoir by instructing the air flow control units to:

direct air outside the enclosure, through the system of air flow ducts, and into said cooling reservoir, and/or direct cooled air from the air-cooling unit, through the system of air flow ducts, and into said cooling reservoir.

In one or more embodiments, the cooling reservoir comprises one or more units comprising a phase change material, such as a salt hydrate, e.g., calcium chloride hexahydrate, sodium sulfate decahydrate, or magnesium chloride hexahydrate. The use of phase change materials is a way to increase the cold storage capacity significantly. The main characteristic of phase change materials is the ability to absorb large amounts of heat when the material changes its phase from solid to liquid. Hence, the heat is absorbed from the air passed through the cooling reservoir and is released again when cold air from outside the enclosure or cooled air from the second chamber is flushed through the cooling reservoir, thereby resulting in a re-solidification of the phase change material. Because the energy is stored as latent energy, this takes place without a significant increase in the temperature of the phase change material itself. Depending on the different properties of the material, phase change materials show a variety of different melting temperatures. Hence, for the present purpose, suitable phase change materials should preferably change their aggregate state within the range of 15 to 50 degrees Celsius. Phase change materials may be inorganic or organic. Inorganic phase change materials (salt hydrates) have advantages in a high latent heat capacity, low price, and good availability. Furthermore, they are not flammable, which is highly relevant in enclosures containing electronic and/or telecommunications equipment. An inorganic salt hydrate (hydrated salt or hydrate) is an ionic compound in which a number of water molecules are attracted by the ions and therefore enclosed within its crystal lattice. The general formula of a hydrated salt is $M_xN_y*nH_2O$, where x, y, and n are an integer of 1 or more. The water molecules inside the crystals of a hydrate mostly make coordinate covalent bonds and hydrogen bonds to the positively charged metal ions (cations) of the salt. Among those hydrated salts, calcium chloride hexahydrate ($CaCl_2*6H_2O$), sodium sulfate decahydrate (Glauber's salt, $Na_2SO_4*10H_2O$), and magnesium chloride hexahydrate ($MgCl_2*6H_2O$) are particularly preferred for their good thermal and physical properties. Organic phase change materials, such as waxes and paraffin, are chemically stable and have a congruent melting behavior. Furthermore, they do not show any tendency towards supercooling.

The phase change materials may be formulated as pure materials (direct incorporation), immersions, or encapsulated. For the present purpose, the phase change materials are preferably encapsulated, e.g., micro encapsulated or macro encapsulated. A suitable example of micro encapsulation is where a wax or paraffin is enclosed in microscopic, small spherical or rod-shaped units enclosed in a polymeric film. A suitable example of macro encapsulation is where the raw phase change material is filled or packed in tubes, spheres, panels or pouches.

In one or more embodiments, the management component is connected to a web server through a network connection and configured to receive data about the current availability of electricity produced from renewable energy sources, preferably also configured to receive data forecasts about the future, such as within hours or days, availability of electricity produced from renewable energy sources, and in response to the processing of said data instruct said air flow control units to direct and distribute air from the air inlet(s) and through a selection of the cabinet's ducts and chambers. Preferably, wherein when electricity produced from renewable energy sources is currently available or forecasted available within a predetermined time period, the management component is configured to a) activate the air-cooling unit when electricity produced from renewable energy sources is currently available, or b) activate the air-cooling unit for at least a part of said time period when electricity produced from renewable energy sources is forecasted available within said time period.

A second aspect relates to a temperature control unit according to the present invention.

A third aspect relates to a temperature-controlled enclosure for containing temperature-sensitive electronic and/or telecommunications equipment, said enclosure comprising:

a roof, a floor, and walls together defining the enclosure;

a first sensor unit configured to measure the temperature at a given time outside the enclosure;

a second sensor unit configured to measure the temperature at a given time inside the enclosure at the floor level;

a third sensor unit configured to measure the temperature at a given time inside the enclosure at the position of said electronic and/or telecommunications equipment;

a temperature control unit comprising:

a) a cabinet with a plurality of chambers, wherein a first chamber is empty, thereby providing a free cooling option, and wherein a second chamber comprises an air-cooling unit;

b) a first air inlet adapted for leading air outside the enclosure into the cabinet and/or a second air inlet adapted for leading air from within the enclosure into the cabinet;

c) a first air outlet adapted for leading air inside the cabinet into the enclosure at the floor level;

d) a system of air flow ducts and air flow control units adapted for directing air from the air inlet(s) and through one or more of said chambers and out through the first air outlet; and e) a management component, preferably being part of a cloud platform, communicatively coupled to said first, second, and third sensor units, said management component comprising:

i) a processor;

ii) a memory in electronic communication with said processor; and iii) instructions stored in said memory, said instructions being executable by said processor to:

I) receive and store data related to an event detected by said sensor units;

II) process said data related to said detected event, including determining the need for cooling and the type of cooling of the enclosure; and III) based on the processing of said data, instruct said air flow control units to direct and distribute air from the air inlet(s) and through a selection of the cabinet's ducts and chambers; and a second air outlet, possibly integrated into the temperature control unit, positioned at the roof level and adapted for leading air out of the enclosure; wherein the cabinet further comprises a third chamber with a cooling reservoir, or a first part of a cooling reservoir, and wherein the management component is configured to charge the cooling reservoir by instructing the air flow control units to:

direct air outside the enclosure, through the system of air flow ducts, and into said cooling reservoir, and/or direct cooled air from the air-cooling unit, through the system of air flow ducts, and into said cooling reservoir.

As used in the specification and the appended claims, the singular forms "a", "an", and "the" include plural referents unless the context clearly dictates otherwise. Ranges may be expressed herein as from "about" or "approximately" one particular value and/or to "about" or "approximately" another particular value.

When such a range is expressed, another embodiment includes from the one particular value and/or to the other particular value. Similarly, when values are expressed as approximations, by use of the antecedent "about", it will be understood that the particular value forms another embodiment.

It should be noted that embodiments and features described in the context of one of the aspects of the present invention also apply to the other aspects of the invention.

DETAILED DESCRIPTION OF THE INVENTION

Figure 1:
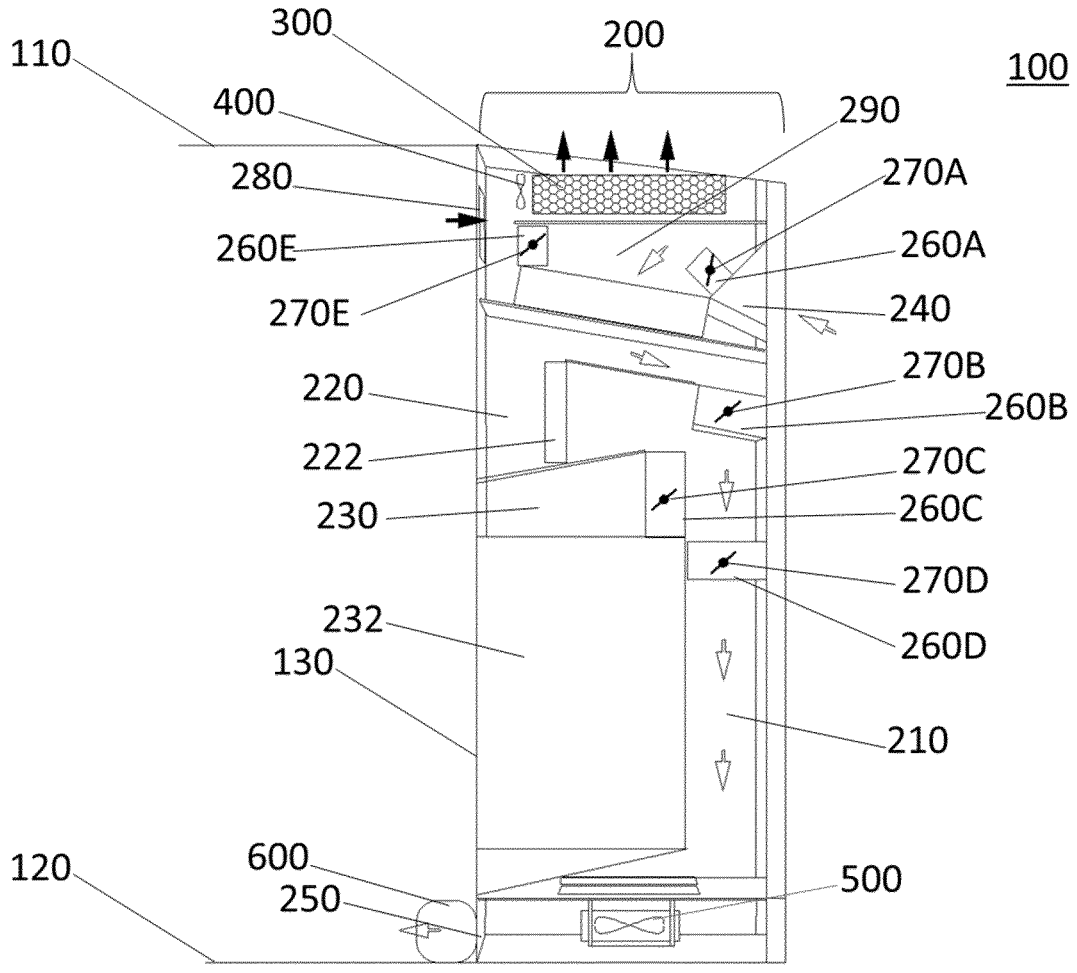
FIGS. 1-9 show a cross-sectional view of a part of a temperature-controlled enclosure for containing temperature-sensitive electronic and/or telecommunications equipment, where different cooling programs are activated.

In order to further elucidate the scope of the invention, different cooling programs are depicted in FIGS. 1-9. All Figures show a cross-sectional view of a part of a temperature-controlled enclosure 100 for containing temperature-sensitive electronic and/or telecommunications equipment (not shown). The enclosure 100 comprises a roof 110, a floor 120, and walls 130. To be able to control the temperature, information about the temperature at a given time is needed. Hence, a first sensor unit (not shown) is configured to measure the temperature at a given time outside the enclosure. A second sensor unit (not shown) is configured to measure the temperature at a given time inside the enclosure at the floor level. Finally, a third sensor unit (not shown) is configured to measure the temperature at a given time inside the enclosure at the position of said electronic and/or telecommunications equipment. A temperature control unit 200 uses this information to activate the appropriate cooling program at a given time. This is important, as cooling generally involves the use of electricity, and the costs of electricity varies over time. Hence, the temperature control unit 200 can activate the right cooling program in terms of minimizing the use of electricity for a given cooling operation and securing the lowest cost of the spent electricity. The cooling programs utilizes different mechanisms or combinations thereof for cooling. These mechanisms are embodied within the temperature control unit 200, that comprises a cabinet with a plurality of chambers 210, 220, 230. A first chamber 210 is empty (including holding equipment that is not actively cooling), thereby providing a free cooling option, i.e., only the outside air is used for the cooling operation. A second chamber 220 comprises an air-cooling unit 222, here in the form of a compressor cooling unit. Finally, the cabinet further comprises a third chamber 230 with a cooling reservoir 232, here in the form of cooling elements (e.g., cold collector elements), e.g., configured to be cooled by a relatively colder passing air stream. The chambers (at least some of them) may be arranged successively, as shown in the examples, and thereby be in air communication with one another, or they (at least some of them) may be stacked with separate inlets and outlets. Mixed configurations are also possible. In the shown example, a first air inlet 240 is adapted for leading air outside the enclosure into the cabinet. Air from the first air inlet 240 reaches a first air flow duct 260A being controlled by a first air flow control unit 270A. Alternatively, or in combination, air may enter the cabinet from the inside of the enclosure 100 through a second air inlet 280. Air from the second air inlet 280 reaches a second air flow duct 260E being controlled by a second air flow control unit 270E. If the second air flow control unit 270E closes the second air flow duct 260E, the air passing through the second air inlet 280 may leave through a second outlet 300 (the first outlet 250 is introduced below). When the second air flow control unit 270E opens the second air flow duct 260E, the air passing through the second air inlet 280 enters an antechamber 290. Similarly, when the first air flow control unit 270A opens the first air flow duct 260A, the air from the first air inlet 240 enters the same antechamber 290. From the antechamber 290, the air passes into the second chamber 220 with the air-cooling unit 222. The air-cooling unit 222 may be turned on or off, depending on the need for cooling. Hence, the second chamber 220 may function like the first chamber 210 if no cooling is necessary. The air may be directed into either the first chamber 210, via a third 260B and/or a fourth 260D air flow duct, controlled by air flow control units 270B/270D, or into the third chamber 230, via a fifth air flow duct 260C controlled by air flow control unit 270C. Alternatively, the air may be directed into both chambers 210, 230 at the same time. Both chambers 210, 230 lead the air through a first air outlet 250 into the enclosure at the floor level.

The air flow control units 270 are operated by a management component (not shown). The management component activates the right cooling program in terms of minimizing the use of electricity for a given cooling operation and securing the lowest cost of the spent electricity preferably being part of a cloud platform. The management component may be connected to a web server through a network connection to receive information about the current market price of electricity, preferably also about forecast of the future market price of electricity, such as the expected price the upcoming day or days. If the electricity market price is below a predetermined threshold, it may choose to activate the air-cooling unit 222. The cooled air may be used to charge the cooling reservoir 232 and/or to cool the enclosure 100. This decision is dependent on the information the management component is configured to receive from the above-mentioned sensor units.

In the following, different cooling programs executed by the management component will be explained by reference to the FIGS. 1-9.

FIG. 1 shows an example where the temperature inside the enclosure 100 is considered too hot to cool by the management component from an economical perspective. Hence, the air from within the enclosure 100 is directed through the second air inlet 280 and directly out of the second outlet 300. The second air flow control unit 270E has been instructed to close the second air flow duct 260E. Fortunately, the air outside the enclosure 100 is considered by the management component to be of a temperature sufficient to cool the electronic and/or telecommunications equipment within the enclosure 100. Hence, the air-cooling unit 222 is turned off, and the air is directed through the second 220 and first 110 chambers and out the first air outlet 250. The flow into the third chamber 230 is blocked by the management component by instructing the fifth air flow control unit 270C to close the fifth air flow duct 260C.

Figure 2:
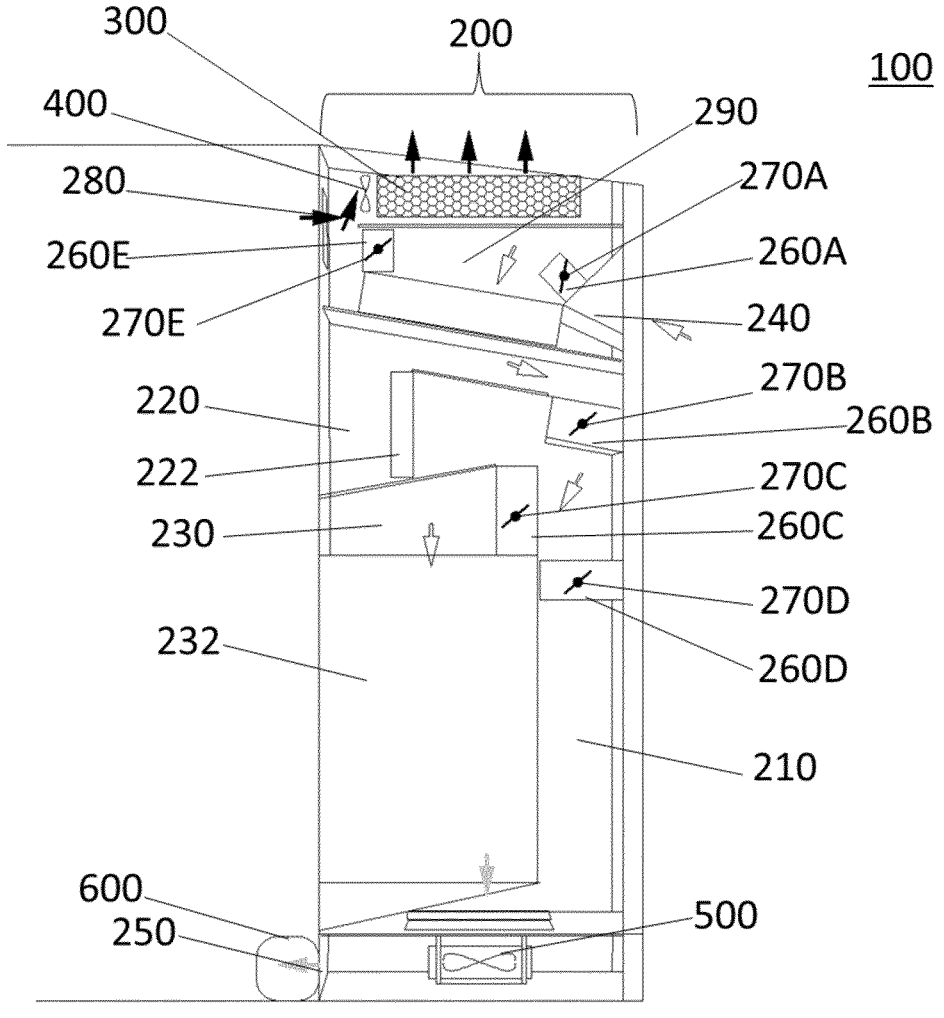

FIG. 2 shows an example where the temperature inside the enclosure 100 is considered too hot to cool by the management component from an economical perspective. Hence, the air from within the enclosure 100 is directed through the second air inlet 280 and directly out of the second outlet 300. The second air flow control unit 270E has been instructed to close the second air flow duct 260E. The air outside the enclosure 100 is considered by the management component to be of a temperature insufficient to cool the electronic and/or telecommunications equipment within the enclosure 100. The air-cooling unit 222 is, however, still turned off, as the current market price of electricity is above a predetermined threshold. Thus, the air is directed through the second chamber 220, into the third chamber 230 and out the first air outlet 250. The flow into the third chamber 230 is opened by the management component by instructing the fifth air flow control unit 270C to open the fifth air flow duct 260C. The flow into the first chamber 210 is blocked by the management component by instructing the fourth air flow control unit 270D to close the fourth air flow duct 260D.

Figure 3:
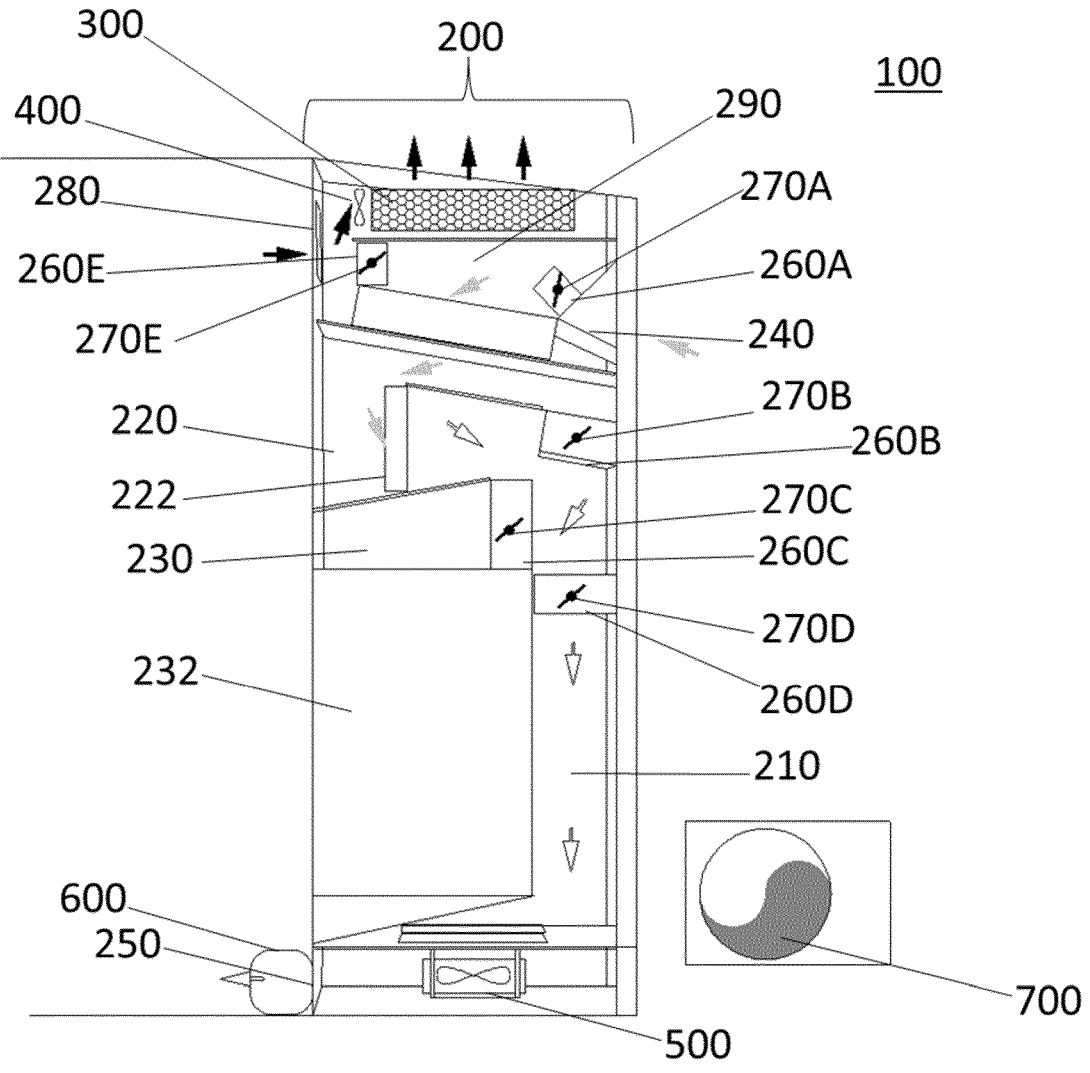

FIG. 3 shows an example where the temperature inside the enclosure 100 is considered too hot to cool by the management component from an economical perspective. Hence, the air from within the enclosure 100 is directed through the second air inlet 280 and directly out of the second outlet 300. The second air flow control unit 270E has been instructed to close the second air flow duct 260E. The air outside the enclosure 100 is considered by the management component to be of a temperature insufficient to cool the electronic and/or telecommunications equipment within the enclosure 100. The air-cooling unit 222 is turned on, as the current market price of electricity is below a predetermined threshold. The air is directed through the second chamber 220, some of the air through the air-cooling unit 222 and some of the air past the air-cooling unit 222 to fine tune the temperature of the air. The latter is made possible via the third air flow control unit 270B acting on (i.e., opening) the third air flow duct 260B. From here, the now cooled air is directed into the first chamber 210 and out the first air outlet 250. The flow into the third chamber 230 is blocked by the management component by instructing the fifth air flow control unit 270C to close the fifth air flow duct 260C, and the flow into the first chamber 210 is controlled by the management component by instructing the by instructing the fourth air flow control unit 270D to open the fourth air flow duct 260D.

Figure 4:
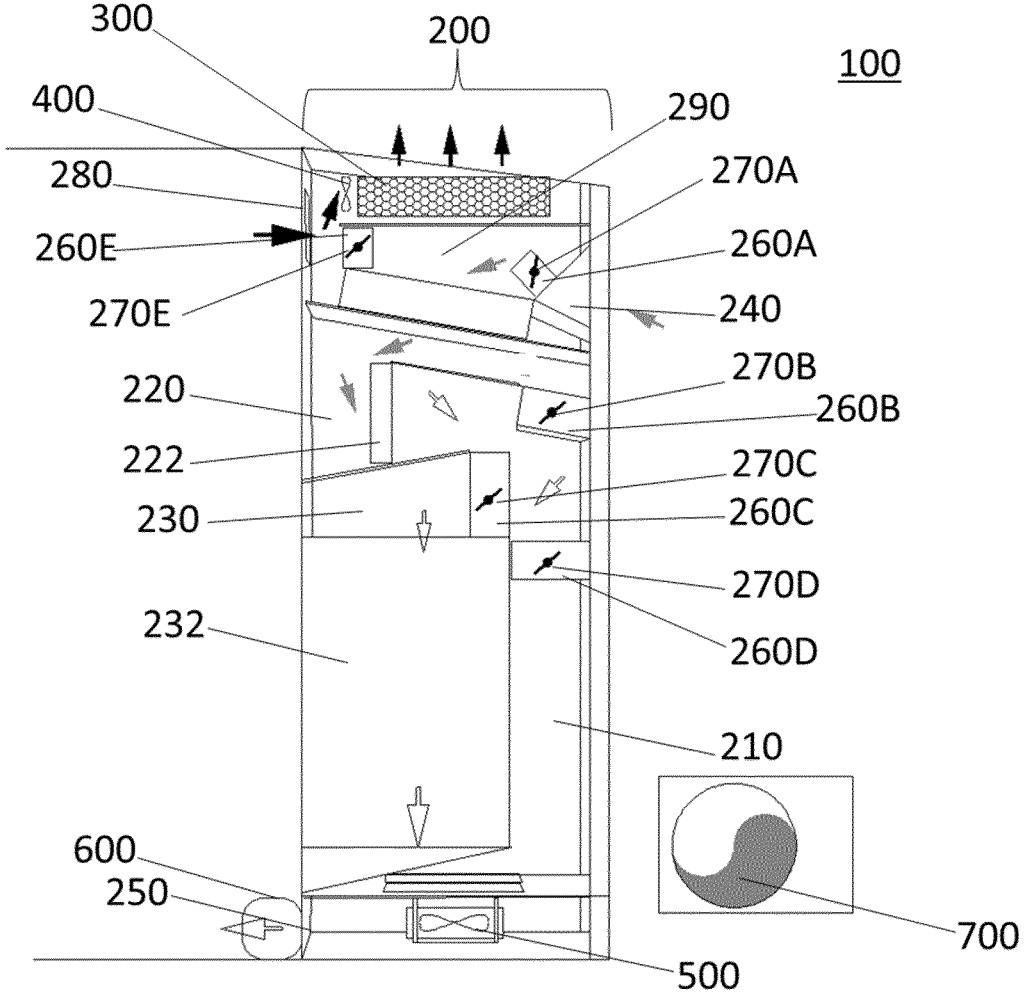

FIG. 4 shows almost the same situation as FIG. 3, with the exception that a part of the cooled air is used to load the cooling reservoir 232 in the third chamber 230. The flow into the first chamber 210 is blocked by the management component by instructing the fourth air flow control unit 270D to close the fourth air flow duct 260D, and the flow into the third chamber 230 is controlled by the management component by instructing the by instructing the fifth air flow control unit 270C to open the fifth air flow duct 260C.

Figure 5:
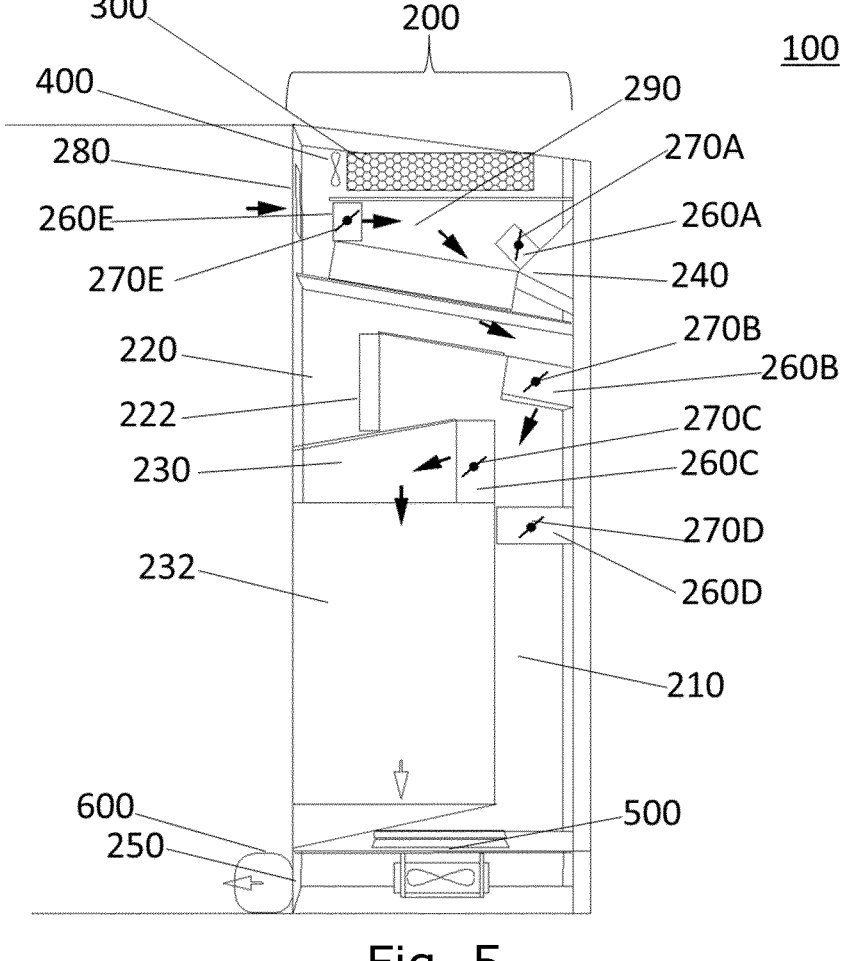

FIG. 5 shows an example where the temperature inside the enclosure 100 is considered optimal to cool by the management component from an economical perspective. Hence, the air from within the enclosure 100 is recycled and directed through the second air inlet 280 and into the antechamber 290. Air from outside the enclosure is not utilized, and could e.g., be due to the temperature being too hot to cool by the management component from an economical perspective. Thus, the management component instructs the first air flow control unit 270A to close the first air flow duct 260A. The air-cooling unit 222 is, however, still turned off, as the current market price of electricity is above a predetermined threshold. Thus, the air is directed through the second chamber 220, into the third chamber 230 and out the first air outlet 250. The flow into the third chamber 230 is opened by the management component by instructing the fifth air flow control unit 270C to open the fifth air flow duct 260C. The flow into the first chamber 210 is blocked by the management component by instructing the fourth air flow control unit 270D to close the fourth air flow duct 260D.

Figure 6:
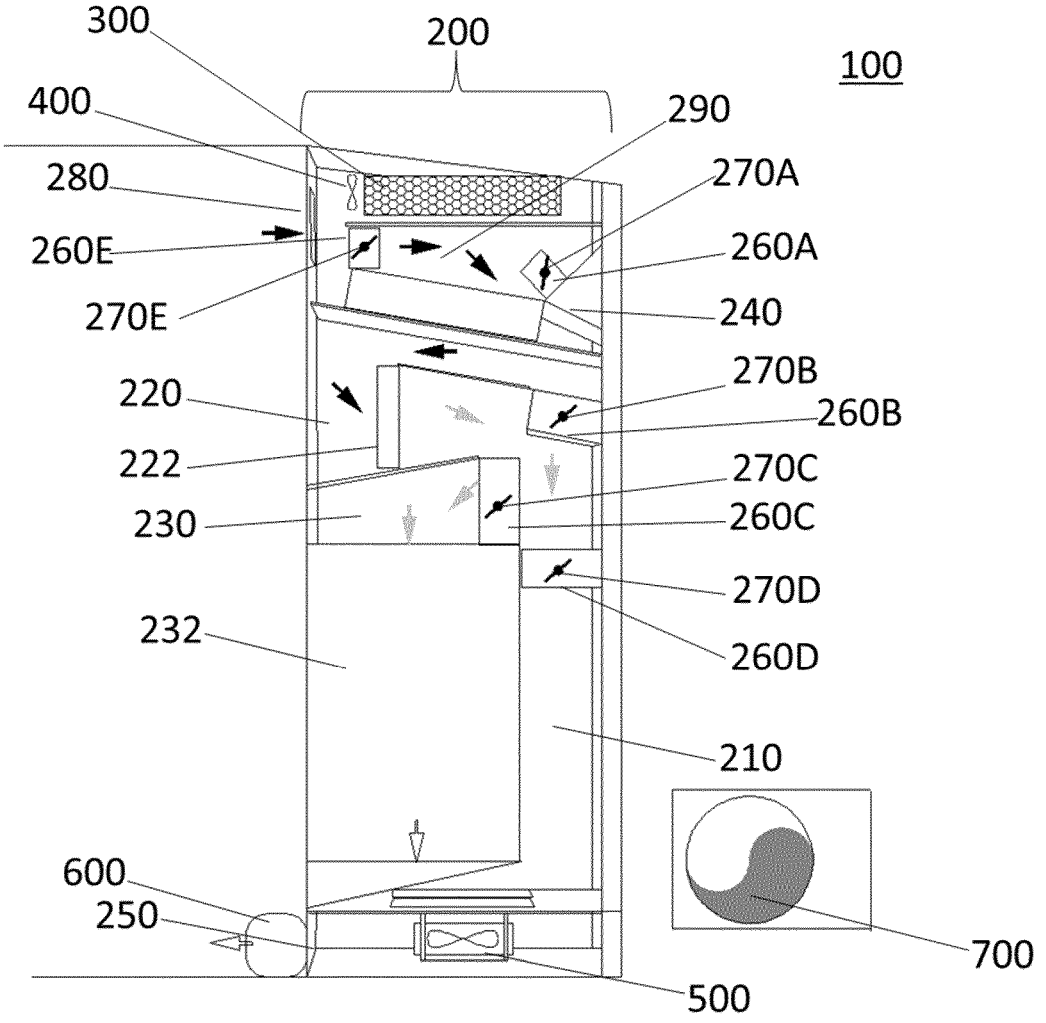

FIG. 6 shows almost the same situation as FIG. 5, with the exception that the management component has determined that the current market price of electricity is ok, i.e., below a predetermined threshold and that the cooling reservoir 232 needs to be involved in the cooling process. Hence, the flow into the first chamber 210 is blocked by the management component by instructing the fourth air flow control unit 270D to close the fourth air flow duct 260D. The flow into the third chamber 230 is opened by the management component by instructing the fifth air flow control unit 270C to open the fifth air flow duct 260C.

Figure 7:
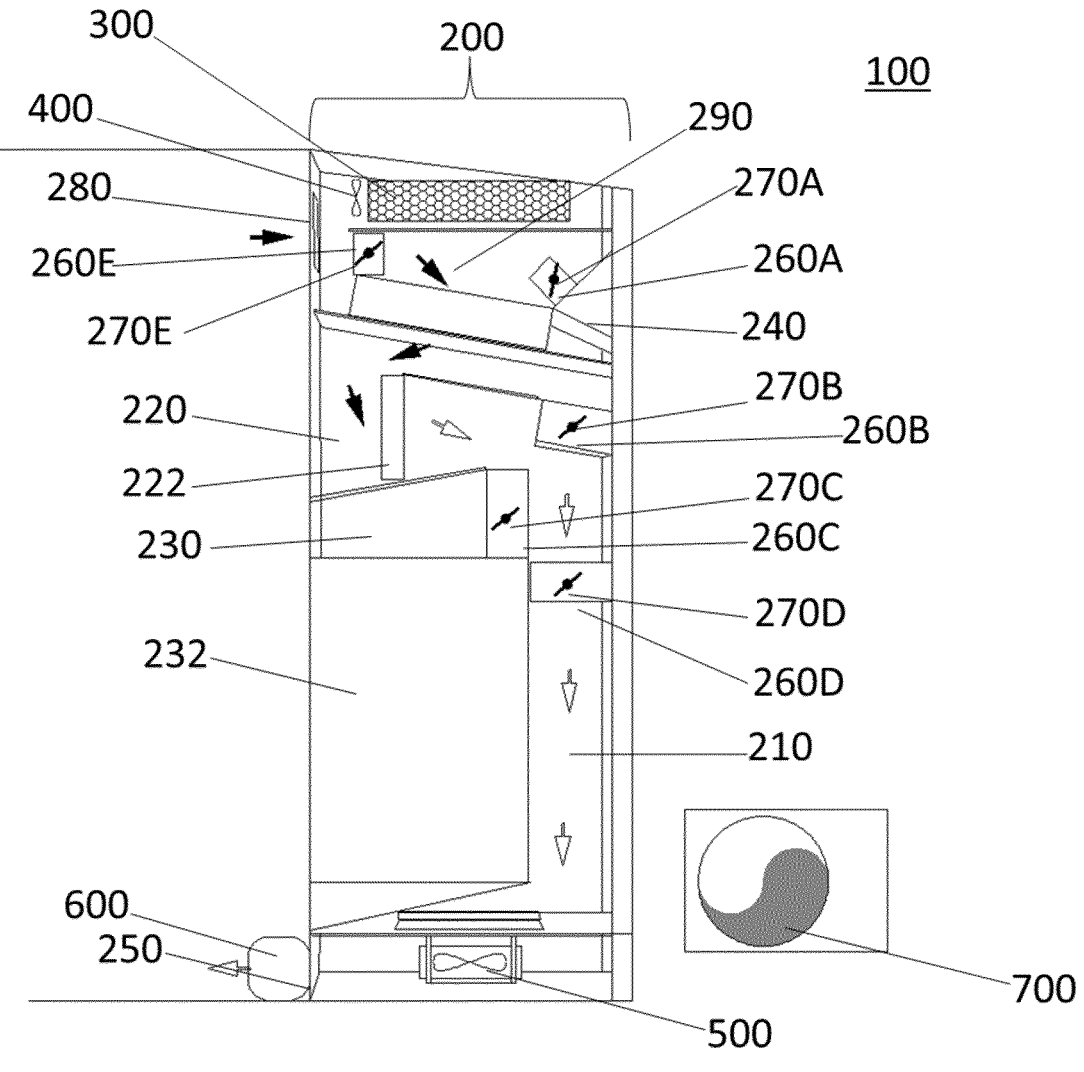

FIG. 7 shows almost the same situation as FIG. 6, with the exception that the management component has determined that the cooling reservoir 232 does not need to be charged. Hence, the flow into the first chamber 210 is opened by the management component by instructing the fourth air flow control unit 270D to open the fourth air flow duct 260D. The flow into the third chamber 230 is closed by the management component by instructing the fifth air flow control unit 270C to close the fifth air flow duct 260C.

Figure 8:
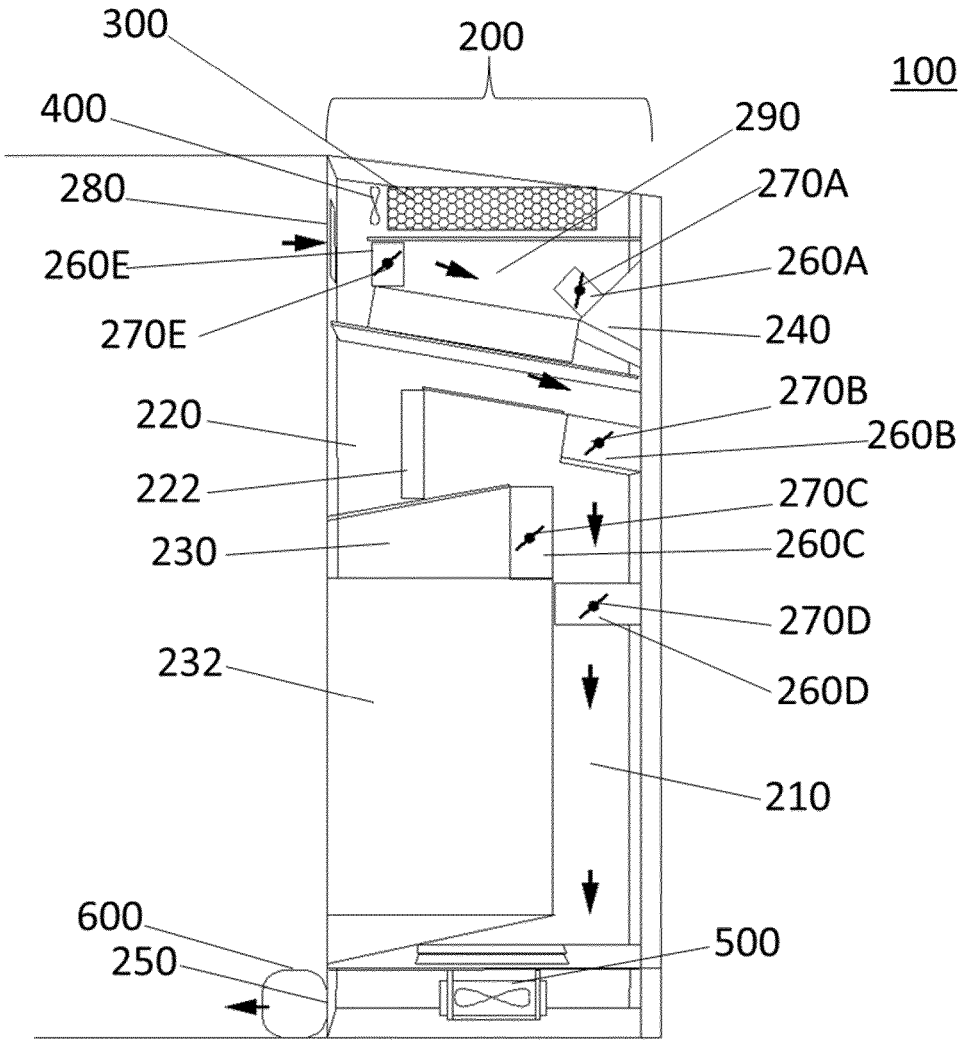

FIG. 8 shows an example where the temperature inside the enclosure 100 is considered optimal to reuse by the management component from an economical perspective. Hence, the air-cooling unit 222 is turned off, and the air is directed through the second 220 and first 110 chambers and out the first air outlet 250. The flow into the third chamber 230 is blocked by the management component by instructing the fifth air flow control unit 270C to close the fifth air flow duct 260C. Air from outside the enclosure is not utilized, and could e.g., be due to the temperature being too hot to use by the management component from an economical perspective. Thus, the management component instructs the first air flow control unit 270A to close the first air flow duct 260A.

Figure 9:
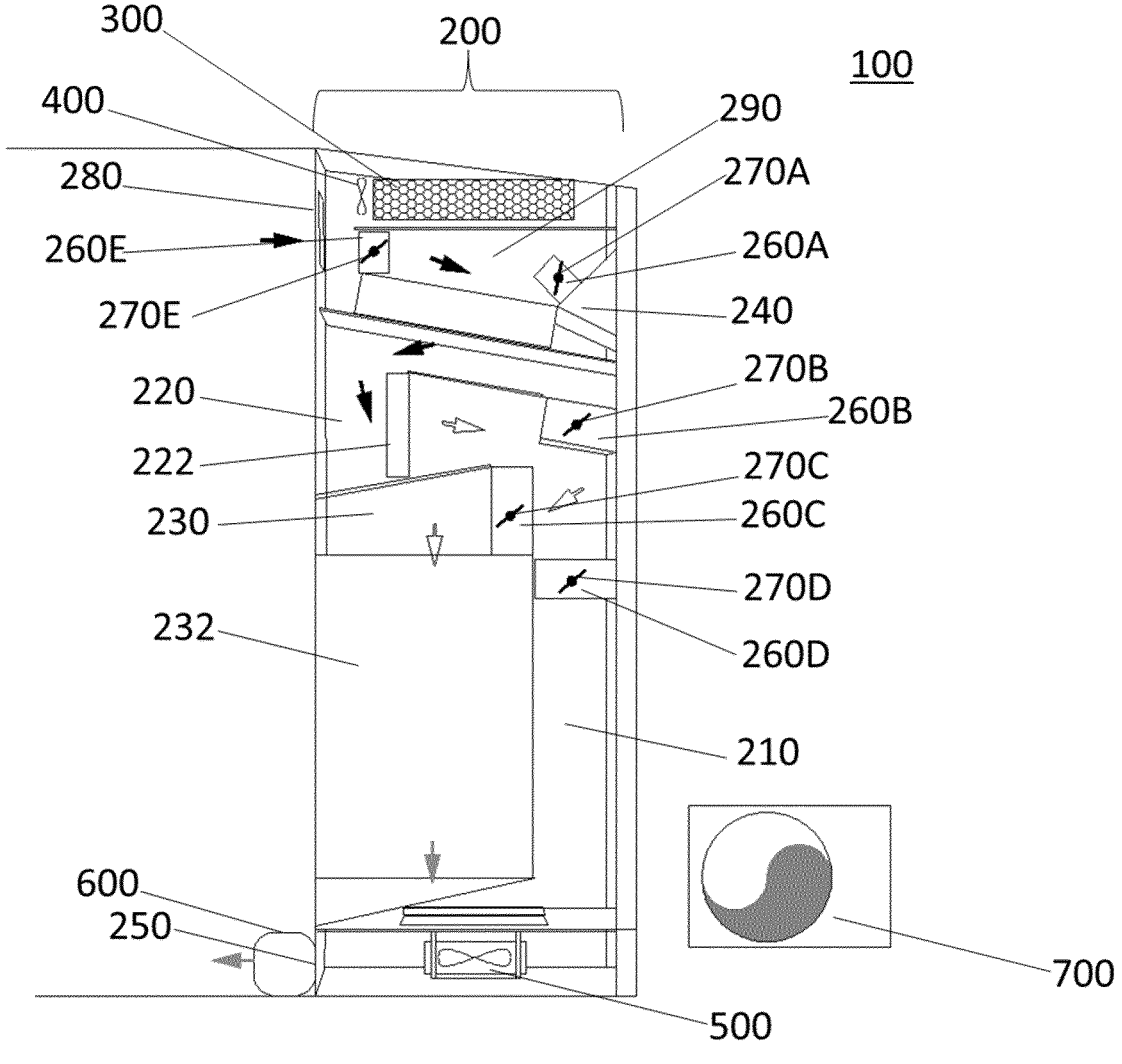

FIG. 9 shows almost the same situation as FIG. 6, with the exception that the management component has determined that the cooling reservoir 232 needs to be charged. Hence, the flow into the first chamber 210 is blocked by the management component by instructing the fourth air flow control unit 270D to close the fourth air flow duct 260D. The flow into the third chamber 230 is opened by the management component by instructing the fifth air flow control unit 270C to open the fifth air flow duct 260C.

The figures are shown with a filter bag 600 (called a displacement bag) mounted in front of the first air outlet 250. The filter bag 600 provides a controlled flow out of the first air outlet 250, thereby preventing air turbulence within the enclosure 100.

A few of the figures are also shown with a heat pump 700 as an example of a part of the air-cooling unit 222.

REFERENCES

100 Enclosure
110 Roof
120 Floor
130 Wall
200 Temperature control unit
210 First chamber
220 Second chamber
222 Air-cooling unit
230 Third chamber
232 Cooling reservoir
240 First air inlet
250 First outlet
260A First air flow duct
260B Third air flow duct
260C Fifth air flow duct 260C
260D Fourth air flow duct
260E Second air flow duct
270A First air flow control unit
270B Third air flow control unit
270C Fifth air flow control unit
270D Fourth air flow control unit
270E Second air flow control unit
280 Second air inlet
290 Antechamber
300 Second outlet
400 First ventilation unit 500 Second ventilation unit
600 Filter bag/displacement bag
700 Heat pump

The invention claimed is:

1. A temperature-controlled enclosure (100) for containing temperature-sensitive electronic and/or telecommunications equipment, said enclosure (100) comprising:
   a roof (110), a floor (120), and walls (130) together defining an interior of the enclosure (100);
   a first sensor unit configured to measure an ambient temperature at a given time outside the enclosure (100);
   a second sensor unit configured to measure an internal temperature at a given time inside the enclosure (100) at a floor level;
   a third sensor unit configured to measure the temperature an internal temperature at a given time inside the enclosure (100) at a location of said electronic and/or telecommunications equipment;
   a temperature control unit (200) comprising:
      a) a cabinet with a plurality of chambers (210, 220, 230), wherein a first chamber (210) is empty, thereby providing a free cooling option, and wherein a second chamber (220) comprises an air-cooling unit (222);
      b) a first air inlet (240) adapted for leading air outside the enclosure (100) into the cabinet and/or a second air inlet (280) adapted for leading air from within the enclosure (100) into the cabinet;
      c) a first air outlet (250) adapted for leading air inside the cabinet into the enclosure (100) at the floor level;
      d) a system of air flow ducts (260) and air flow control units (270) adapted for directing air from the air inlet(s) (240, 280) and through one or more of said chambers (210, 220, 230) and out through the first air outlet (250); and
      e) a management component, being part of a cloud platform, communicatively coupled to said first, second, and third sensor units, said management component comprising:
         i) a processor;
         ii) a memory in electronic communication with said processor; and
         iii) instructions stored in said memory, said instructions being executable by said processor to:
            I) receive and store data related to an event detected by said sensor units;
            II) process said data related to said detected event, including determining the need for cooling and the type of cooling of the enclosure (100); and
            III) based on the processing of said data, instruct said air flow control units to direct and distribute air from the air inlet(s) (240, 280) and through a selection of the cabinet's ducts (260) and chambers (210, 220, 230); and
         a second air outlet (300), possibly integrated into the temperature control unit (200), positioned at a roof level and adapted for leading air out of the enclosure (100);
   wherein the cabinet further comprises a third chamber (230) with a cooling reservoir (232), or a first part of a cooling reservoir, and wherein the management component is configured to charge the cooling reservoir (232) by instructing the air flow control units (270) to:
      direct air outside the enclosure, through the system of air flow ducts (260), and into said cooling reservoir (232), and/or direct cooled air from the air-cooling unit (222), through the system of air flow ducts (260), and into said cooling reservoir (232).

2. The temperature-controlled enclosure (100) according to claim 1, wherein the management component is connected to a web server through a network connection and configured to receive data about a current market price of electricity, and also configured to receive data forecasts about a future event, such as within hours or days, a then current market price of electricity, and in response to the processing of said data instruct said air flow control units (270) to direct and distribute air from the air inlet(s) (240, 280) and through a selection of the cabinet's ducts (260) and chambers (210, 220, 230).

3. The temperature-controlled enclosure (100) according to claim 2, wherein when the current market price of electricity is below a predetermined threshold, the management component is configured to activate the air-cooling unit (222).

4. The temperature-controlled enclosure (100) according to claim 1, wherein when a current market price of electricity is above a predetermined threshold, the management component is configured to deactivate the air-cooling unit (222).

5. The temperature-controlled enclosure according to claim 1, wherein the cooling reservoir (232) comprises one or more units comprising a phase change material, such as a salt, hydrate comprising calcium chloride hexahydrate, sodium sulfate decahydrate, or magnesium chloride hexahydrate.

6. The temperature-controlled enclosure according to claim 1, wherein the temperature control unit (200) comprises both a first (240) and a second (280) air inlet, and wherein the temperature control unit (200) further comprises an antechamber (290) adapted for receiving air from the first (240) and the second (280) air inlets.

7. The temperature-controlled enclosure according to claim 6, wherein the temperature control unit (200) further comprises a second air flow duct (260E) and a second air flow control unit (270E) adapted for directing air from the second air inlet (280) and into the antechamber (290), wherein the temperature control unit (200) further comprises a first air flow duct (260A) and a first air flow control unit (270A) adapted for directing air from the first air inlet (240) and into the antechamber (290); and wherein the management component is configured to instruct the second (270E) and first (270A) air flow control units to open or close, respectively, the second (260E) and first (260A) air flow ducts in response to the processing of said data related to said detected event.

8. The temperature-controlled enclosure (100) according to claim 1, wherein the management component is connected to a web server through a network connection and configured to receive data about the current availability of electricity produced from renewable energy sources, and also configured to receive data forecasts about the future, such as within hours or days, availability of electricity produced from renewable energy sources, and in response to the processing of said data instruct said air flow control units (270) to direct and distribute air from the air inlet(s) (240, 280) and through a selection of the cabinet's ducts (260) and chambers (210, 220, 230).

9. The temperature-controlled enclosure (100) according to claim 8, wherein when electricity produced from renewable energy sources is currently available or forecasted available within a predetermined time period, the management component is configured to a) activate the air-cooling unit (222) when electricity produced from renewable energy sources is currently available, or b) activate the air-cooling unit (222) for at least a part of said time period when electricity produced from renewable energy sources is forecasted available within said time period.

10. The temperature-controlled enclosure according to claim 1, wherein the temperature control unit (200) further comprises a displacement bag (600) mounted in front of the first air outlet (250), thereby preventing air turbulence within the enclosure (100).

11. The temperature-controlled enclosure according to claim 1, wherein the first part of the cooling reservoir comprises a first radiator, wherein the cooling reservoir further comprises a second part in the form of a) a tank filled with a phase change material and positioned outside said enclosure, b) a coolant, and c) a second radiator positioned within said tank, wherein said first radiator is operably coupled to said second radiator, and wherein said coolant is circulated between said first and second radiator by a pump unit.

12. The temperature-controlled enclosure according to claim 11, wherein the management component is configured to charge the cooling reservoir by instructing the air flow control units to:

direct air outside the enclosure, through the system of air flow ducts (260), and into said third chamber (230), and/or direct cooled air from the air-cooling unit (222), through the system of air flow ducts (260), and into said third chamber (230).

* * * * *